（12) United States Patent
Natarajan

(10) Patent No.: US 8,841,935 B1
(45) Date of Patent: Sep. 23, 2014

(54) EFFICIENT RECONFIGURABLE LOGIC TILE

(71) Applicant: Texas Instruments Incorporated, Dallas, TX (US)

(72) Inventor: Venkatesh Natarajan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 39 days.

(21) Appl. No.: 13/847,298

(22) Filed: Mar. 19, 2013

(51) Int. Cl.
*H03K 19/177* (2006.01)
*H03K 19/0175* (2006.01)

(52) U.S. Cl.
CPC ............ *H03K 19/017581* (2013.01)
USPC ............................. 326/38; 326/41

(58) Field of Classification Search
CPC ........... H03K 19/177; H03K 19/17704; G06F 17/5054; G06F 15/7867; G06F 2217/64
USPC ...................................... 326/37–41
See application file for complete search history.

(56) References Cited

U.S. PATENT DOCUMENTS

| | | | |
|---|---|---|---|
| 6,260,087 B1 * | 7/2001 | Chang ........................ | 710/100 |
| 2008/0258762 A1 * | 10/2008 | Koo ............................ | 326/38 |
| 2010/0169857 A1 * | 7/2010 | Campi et al. ............... | 716/8 |

* cited by examiner

*Primary Examiner* — Don Le
(74) *Attorney, Agent, or Firm* — John R. Pessetto; Frederick J. Telecky, Jr.

(57) ABSTRACT

An application specific integrated circuit (ASIC) that includes a digital signal processing (DSP) core and a configurable logic block coupled to the DSP core. The configurable logic block including a plurality of interconnected logic modules to apply a pre-configured logic function to an input. Each of the plurality of logic modules including a controller and a plurality of logic components, the controller of each logic module dynamically reconfigures the connections between the controller's logic module and another logic module.

15 Claims, 2 Drawing Sheets

EFFICIENT RECONFIGURABLE LOGIC TILE

CROSS-REFERENCE TO RELATED APPLICATION

Not applicable.

BACKGROUND

Re-configurable logic devices are used in many areas of industry and are especially adept at signal processing tasks. Field-programmable logic/gate arrays (FPLAs, FPGAs) are one type of re-configurable logic device, complex logic devices (CPLDs) being another example. Application Specific Integrated circuits (ASICs) are also used in the industry for a variety of tasks. These ASICs tend to be much more area efficient and higher performance compared to reconfigurable logic devices. However, once an ASIC is built, any changes or modification may require a rebuild of the entire device and is an expensive and time consuming process.

SUMMARY

The problems noted above are solved in large part by an ASIC that includes a digital signal processing (DSP) core and a configurable logic block coupled to the DSP core. The configurable logic block includes a plurality of interconnected logic modules to apply a pre-configured logic function to an input. Each of the plurality of logic modules includes a controller and a plurality of logic components. The controller of each logic module dynamically reconfigures the connections between the controller's logic module and another logic module.

Another solution may involve an ASIC that includes a processor, a memory device coupled to the processor, and a configurable logic block coupled to the processor. The configurable logic block includes a plurality of interconnected logic modules where each logic module is to apply a logic operation to a set of inputs. Each of the plurality of interconnected, logic modules includes a plurality of logic components to apply the logical operation to the selected inputs and a controller to dynamically reconfigure the plurality of logic components. The plurality of logic components in one logic module are coupled to the plurality of logic components of another logic module, and the connections between logic components of different logic modules changes from one time-slice of a clock-cycle to the next time-slice of the clock-cycle and are dynamically reconfigurable by the controller.

And yet another solution may involve an ASIC that includes a processor, a memory device coupled to the processor, and a configurable logic block coupled to the processor. The configurable logic block includes a plurality of interconnected logic modules, each of the logic modules to implement a logic operation and the interconnections of the logic modules are dynamically configurable. Each of the plurality of logic modules includes a controller coupled to a processor and reconfigures a plurality of logic components. The plurality of logic components implements the logic operation. The logic components of one logic module are connected to the logic components of another logic module and the connections between the logic components of the separate logic modules are different depending on a time-slice of a clock-cycle.

BRIEF DESCRIPTION OF THE DRAWINGS

For a detailed description of exemplary embodiments of the invention, reference will now be made to the accompanying drawings in which.

NOTATION AND NOMENCLATURE

Figure 1:
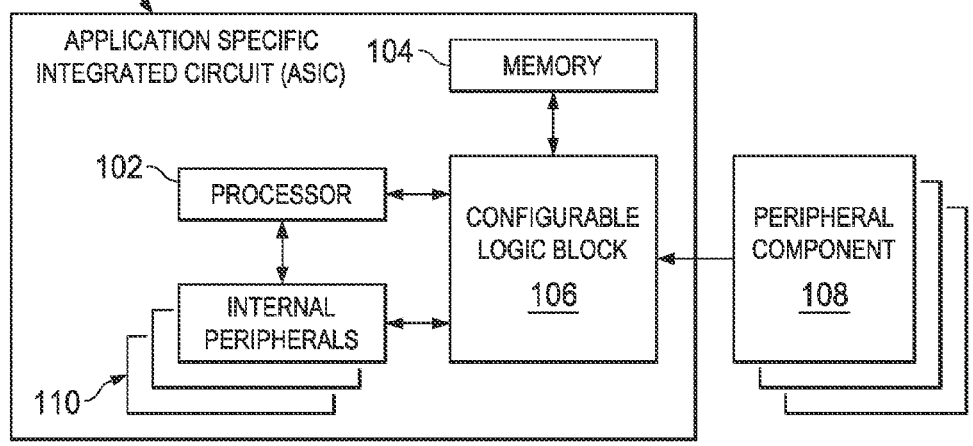
FIG. 1 shows a block diagram of an application specific integrated circuit (ASIC) implementing an area efficient reconfigurable logic tile in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Reconfigurable logic devices and ASICs are used for a variety of purposes in industry like motor control, power supplies, communication, monitoring of systems, image processing, etc. While reconfigurable logic devices provide flexibility to modify operations on the fly, they tend to be inefficient from the area, speed and cost perspective compared to an equivalent ASIC implementation. However, ASICs have the disadvantage that once the Silicon is processed, any changes to the ASIC would need a complete rebuild form design through Silicon processing. For example, if an ASIC that is built for a certain version of a communication protocol needs to be enhanced to support a new standard, this will not be possible. A reconfigurable logic device on the other hand may just be reprogrammed to support the new standard. Disclosed herein are ASICs that comprise a configurable logic block (CLB) that implements various logic functions using reconfigurable, low level functional logic blocks that are configured and reconfigured by an associated controller. The CLB may comprise a plurality of logic modules, with each logic module comprising a controller and a plurality of reconfigurable logic components. Besides reconfiguring the logic applied by the logic components, the controller may also reconfigure the interconnections of the logic modules and incorporate time-slicing so that the interconnections are different for different slots, or time-slices, of a clock-cycle.

Reconfiguring the logic and interconnections of the CLB may be performed by the controllers associated with the logic module vie commands received by a processor of the ASIC coupled to the CLB and the reconfiguration may be completed dynamically while the ASIC is using the CLB for various functions.

FIG. 1 shows a block diagram of an application specific integrated circuit (ASIC) 100 implementing an area efficient reconfigurable logic tile in accordance with various embodiments. The ASIC 100 comprises a processor102 (e.g., a DSP core), a memory device 104, a configurable logic block (CLB) 106, an internal peripheral block 110. The ASIC 100 may receive inputs and direct outputs to a peripheral component 108. Only one peripheral component 108 is depicted in FIG. 1, but the ASIC 100 may receive inputs and direct outputs to any number of such devices. The peripheral device 108 may be a router, a wireless transmitter, or a display device, to name a few examples.

The processor 102 may be used to process programs or threads of programs for digital signal applications and may use the memory 104 and the CLB 106 to assist with the applications. The memory 104 may be used to store data or code used by the applications running on the processor 102. Additionally, the memory 104 may send and receive data to and from the CLB 106. The CLB 106 may also receive data from the processor 102 or from the peripheral device 108, which may be located outside of the ASIC 100. The internal peripheral 110 may be coupled to the processor 102 and the CLB 106 and may provide additional inputs and outputs to be used by the application being executed by the processor 102. The internal peripheral device 110 may provide inputs directly to the CLB 106 or to the processor 102. Further, the CLB 106 may directly output data to the internal peripheral 110. The internal peripheral 110 may be a pulse width modulator (PWM) or a quadrature encoder pulse (QEP), to name a couple of examples.

The CLB 106 may implement user-defined logic instructions, which may be configured or reconfigured at run time. The CLB 106 may comprise of a plurality of logic cells, or logic modules, which implement the user defined logic functions. The software executing on the processor 102 may configure and reconfigure the logic function being applied by the CLB 106 at any time the software is being executed by the processor 102. As such, the CLB 106 may perform an array of logic functions, which may be dynamically reconfigurable by the processor 102 while the ASIC 100 is operating. Dynamically reconfigurable, as used herein, refers to the ability to reconfigure the logic functions and the internal connectivity based on the active operations occurring within the CLB 106 while it is still functioning.

Figure 2:
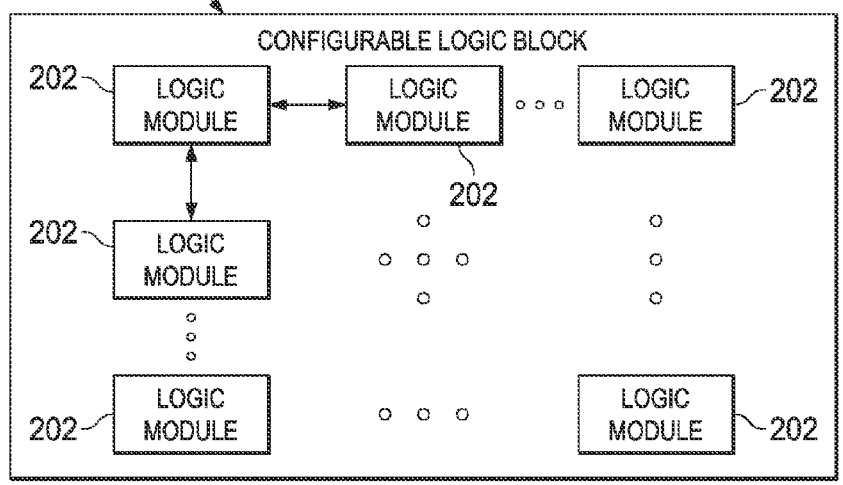
FIG. 2 shows a block diagram of a configurable logic block for implementing an area efficient reconfigurable logic tile in accordance with various embodiments.

FIG. 2 shows a block diagram of a CLB 106 for implementing an area efficient reconfigurable logic tile in accordance with various embodiments. The CLB 106 comprises a plurality of interconnected logic modules 202, or logic cells. Each of the plurality of logic modules may be configured and reconfigured to implement a variety of logic functions at different levels of abstraction. For example, a logic module 202 may be configured to implement a specific Boolean function and then reconfigured to implement a specific logic gate. In addition to configuring/reconfiguring their logic function, the interconnection between the plurality of logic modules 202 may also be configured/reconfigured. Changing the logic and interconnections may be directed by software executing on the processor 102.

The CLB 106 may also implement time-slicing of the interconnections between the plurality of logic modules 202. As used herein, time-slicing refers to dividing a clock-cycle of the ASIC 100 into multiple slots, or time-slices, and the interconnections between the plurality of logic modules 202 may be different from one time-slice to the next. Thus, for example, logic module A may communicate with logic module C during one time-slice and then logic module A may communicate with logic module G during the next time slice. Thus, time-slice configuration of each of the plurality of logic modules 202 may also be reconfigured by an application executing on the processor 102.

Figure 3:
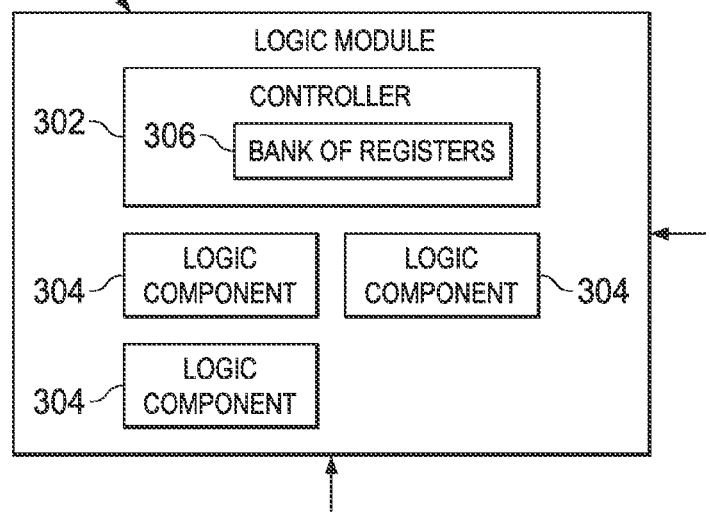
FIG. 3 shows a block diagram of a logic module for implementing an area efficient reconfigurable logic tile in accordance with various embodiments.

FIG. 3 shows a block diagram of a logic module 202 for implementing an area efficient reconfigurable logic tile in accordance with various embodiments. Each of the logic modules 202 comprises a controller 302 and a plurality of logic components 304. The controller 302 may perform several tasks for its associated logic module 202. The controller 302 may interface with other logic modules 202, the processor 102, the memory 104 and any peripheral components 108 that may input or receive data from the CLB 106. Additionally, the controller 302 may receive instructions from the processor 102 to reconfigure the logic applied by the controller 302's logic module 202. The controller 302 may also be responsible for reconfiguring the connections and time-slice configuration of the controller 302's logic module 202.

The logic module 202's logic components may be responsible for performing the logic function, or functions, the logic module 202 has been configured to perform. Each of the plurality of logic components may be configured to perform different logic operations at the different levels of abstraction. The configuration/reconfiguration of the logic components 304 perform may be performed by the controller 302 in accordance with received commands from the processor 102. The controller 302 may also implement the reconfiguration of the interconnections and time-slicing configuration for the controller 302's logic module 202. For example, if the logic module B sends an output to logic module D during a first time-slice and then the logic module B sends a different output to the logic module F during the second time-slice, the controller 302 may reconfigure that connection so that the outputs are reversed. In addition, the controller can also modify the functionality and operation of the logic components Each of the high level controllers 302 may comprise a bank of registers 306 that dictate the logic operation performed by each of the logic module's logic components and the interconnects that should be performed during each time-slice of a clock-cycle. These registers 306 may be altered by software executing on the processor 102 to reconfigure the logic functions being applied and the interconnections of the logic module 202. Each of the plurality of logic modules 202 may connect and communicate with any of the other logic modules 202 and they may communicate with different logic modules during each time-slice of a clock-cycle.

Figure 4:
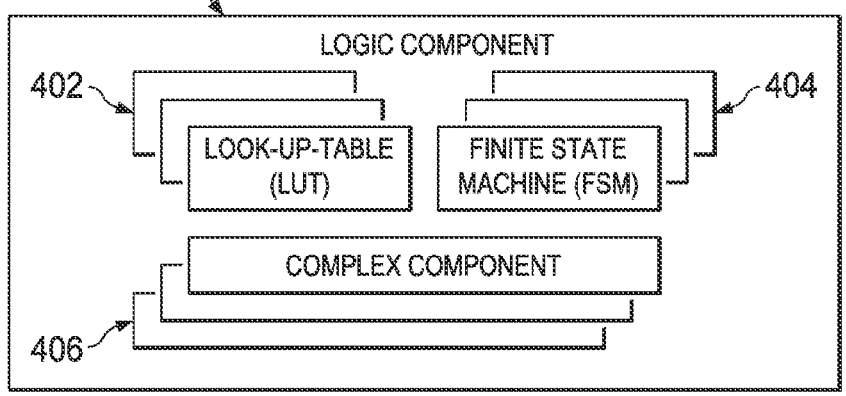
FIG. 4 shows a block diagram of a logic component in accordance with various embodiments.

FIG. 4 shows a block diagram of a logic component 304 in accordance with various embodiments. Each logic component 304 contained in the plurality of logic modules 202 comprises a plurality of look-up-tables (LUTs) 402, a plurality of finite state machines (FSM) 404, and a plurality of complex blocks 406. Each of these finer blocks—LUTs 402, FSMs 404, and complex blocks 406 may be reconfigured by the controller 302. Further, the outputs (or inputs, depending on how it is viewed) may also be reconfigured to go to (come from) the logic components associated with other logic modules during each time-slice.

Each of the plurality of LUTs 402 may be three or four-inputs. Each of the plurality of LUTs 402 may be used to address other logic modules 202 for connections and the plurality of LUTs 402 may be altered so that the associated logic module 202 may communicate with different combinations of other logic modules 202.

Each of the plurality of FSMs 404 may be configured to be either a four-state FSM or two two-state FSMs and their configuration may be changed by their associated controller 302. The FSMs 404 may be used by the CLB 106 to perform sequential digital logic operations, that is operations which involve states and state transitions.

Each of the complex blocks 406 are also configurable to perform various mathematical or logic operations. The controller 302 may configure a complex block 406 to be an adder, a comparator, a shifter, or a counter. With each of the plurality of logic components 304 capable of performing the array of tasks allowed by the combination of the LUTs 402, the FSMs 404, and the complex blocks 406, each logic module 202, and by extension the CLB 106, may be able to perform a vast array of logic operations of varying complexity. This flexibility allows a program executing on the processor 102 of the ASIC 100 to configure the CLB 106 to perform a multitude of tasks and dynamically change those tasks as needed.

Moreover, the time-slicing of each of the logic modules 202 may be manipulated at even finer detail when the different functional blocks—LUTs, FSMs, complex blocks—of the logic components 304 are taken into account. The connections between the plurality of logic modules 202 may correspond to an output of one functional block of a logic component 304 belonging to one logic module being an input to a functional block of a logic component of a different logic module. For example, a LUT of logic module A may be connected to, or send its output to, a FSM of logic module C during a time slice. Then, the LUT output of logic module A may be connected to a complex component of logic module H the next time-slice. These connections may repeat, or cycle, periodically until the controller of logic module A reconfigures the time-slicing of the associated LUT.

Thus, not only is the logic performed by each functional block reconfigurable by the CLB 106, but also the interconnections and the time-slicing configuration within the CLB 106. Additionally, the reconfiguration of all three of these aspects may be performed dynamically by the CLB 106 without taking the ASIC 100 off line.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An application specific integrated circuit (ASIC), comprising:
   a digital signal processing (DSP) core; and
   a configurable logic block coupled to the DSP core and comprising a plurality of interconnected logic modules to apply a pre-configured logic function to an input;
   each of the plurality of logic modules, comprising:
      a controller; and
      a plurality of logic components, wherein the controller of each logic module dynamically reconfigures the connections between the controller's logic module and another logic module;
   wherein an output of a logic component in one logic module is connected to an input of a logic component of another logic module during a time-slice of a clock-cycle.

2. The device of claim 1, wherein the connection between the logic components of different logic modules is time-sliced so that the output of one logic component is connected to a different input of another logic component in a different time-slice of the clock-cycle.

3. The device of claim 1, wherein the clock-cycle is broken into multiple time-slices.

4. An application specific integrated circuit (ASIC), comprising:
   a processor;
   a memory device coupled to the processor;
   a configurable logic block coupled to the processor comprising a plurality of interconnected logic modules, each logic module to apply a logic operation to a set of inputs
   each of the plurality of interconnected, logic modules, comprising:
      a plurality of logic components to apply the logical operation to the selected inputs; and
      a controller to dynamically reconfigure the plurality of logic components;
   wherein the plurality of logic components in one logic module are coupled to the plurality of logic components of another logic module; and
   wherein the connections between logic components of different logic modules changes from one time-slice of a clock-cycle to the next time-slice of the clock-cycle and are dynamically reconfigurable by the controller.

5. The system of claim 4, wherein the time-slice is a segment of the clock-cycle and each clock-cycle has multiple time-slices.

6. The system of claim 4, wherein the controller of a logic module receives an instruction from the processor to reconfigure the logic applied by one of the logic components associated with that logic module.

7. The system of claim 4, wherein one logic module can be instructed to dynamically reconfigure one of the plurality of logic components.

8. An application specific integrated circuit (ASIC), comprising:
   a processor;
   a memory device coupled to the processor;
   a configurable logic block coupled to the processor, comprising:
      a plurality of interconnected logic modules, each of the logic modules to implement a logic operation and the interconnections of the logic modules are dynamically configurable;
      each of the plurality of logic modules comprising:
         a controller coupled to a processor and to reconfigure a plurality of logic components;
         the plurality of logic components to implement the logic operation; and
      wherein the logic components of one logic module are connected to the logic components of another logic module and the connections between the logic components of the separate logic modules are different depending on a time-slice of a clock-cycle.

9. The device of claim 8, wherein the controller of each logic module configures the logic operation implemented by the plurality of logic components.

10. The device of claim 8, wherein the controller of each logic module receives an instruction from the processor to reconfigure the connections between the controller's associated plurality of logic components and the logic components of another logic module.

11. The device of claim 8, wherein the controller of each logic module receives an instruction from the processor to reconfigure the logic applied by one of the plurality of logic components associated with that controller.

12. The device of claim 8, wherein the processor can dynamically instruct the controller of a logic module to change the logic applied by one of the module's plurality of logic components.

13. The device of claim 8, wherein each controller can alter the logic applied by the logic module by reconfiguring a Boolean operation applied.

14. The device of claim 13, wherein each controller can alter the logic applied by the logic module by reconfiguring one of the plurality of logic components at a logic gate level.

15. The device of claim 8, wherein each controller alters the connectivity between the plurality of the logic components within a module.

\* \* \* \* \*